Dec. 8, 1970 H. J. WHITE 3,546,489
COMPLEMENTARY BISTABLE CIRCUIT HAVING
DELAYED TURN-ON AND TURN-OFF
Filed July 18, 1968
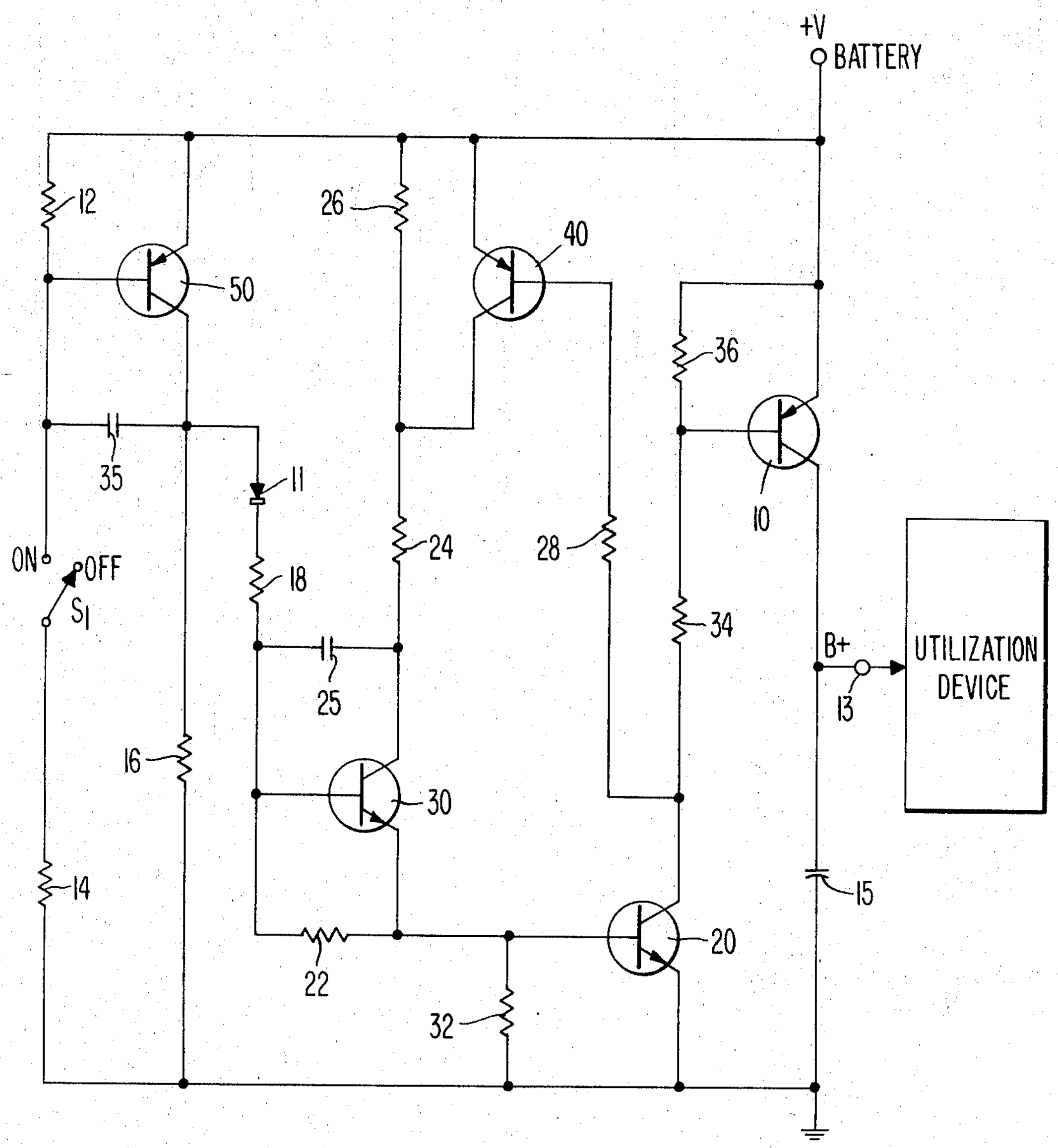
INVENTOR.
HERBERT J. WHITE
BY
Francis A. Varallo
AGENT

United States Patent Office 3,546,489

Patented Dec. 8, 1970

3,546,489

COMPLEMENTARY BISTABLE CIRCUIT HAVING DELAYED TURN-ON AND TURN-OFF

Herbert J. White, Narberth, Pa., assignor to Burroughs Corporation, Detroit, Mich., a corporation of Michigan

Filed July 18, 1968, Ser. No. 745,788

Int. Cl. H03k *3/286*

U.S. Cl. 307—288 7 Claims

ABSTRACT OF THE DISCLOSURE

The present disclosure describes a complementary bistable circuit which serves as a power switch and utilizes solid state components to provide current to load circuits after a fixed delay from the time of switch turn-on and to maintain such current for a predetermined period after switch turn-off—the purpose of such action being to preclude or minimize transient electrical noise in the load current, which might adversely affect the load circuits.

BACKGROUND OF THE INVENTION

The present invention pertains to the use of battery-operated electronic equipment and deals with the problem of transient electrical noise and its effect on the logic circuits to which the battery furnishes power.

There is a general need for a noise immune source of electrical current for powering electronic equipment which is sensitive to power supply electrical transients. For example the closure of electrical switch contacts to supply power to such equipment, results in transients for a period of time immediately following such closure. One method of preventing the transients from reaching the sensitive equipment might be to interject between the switch and the load a delay means operative upon switch closure, such as a monostable multivibrator. However this technique is deficient because although it provides initial protection upon turn-on, it has no effect thereafter—the opening of the switch contacts or interruption of the source potential after the initial period would immediately be reflected in the output current delivered to the equipment. Likewise, decoupling techniques were not appropriate for the application served by the present invention, because they entail large values of capacitance. This in turn would mean loss of space because of the larger physical size of the components, and higher leakage current with concomitant current drain during standby conditions, that is with no power being supplied to the load.

SUMMARY OF THE INVENTION

The present invention was conceived to meet the requirement that would supply noise-free current to logic circuits which were suceptible to electrical noise, in order to preclude the possibility of spurious ouput signals from said circuits. The power switch of the invention was designed to draw no current from the battery source, with the exception of semiconductor and other leakage currents, with the on-off switch contacts open; and to provide a predetermined delay between the time the switch contacts are closed and current begins to flow to the logic circuits; and to maintain the flow of current to such circuits for a predetermined period after the switch contacts are again opened.

In order to accomplish these results the present invention provides a novel combination of a Miller integrator circuit and a complementary bistable multivibrator, which utilize solid state electronic components. The principle exploited by the invention in producing a bistable circuit with delayed turn-on and turn-off is that the collector current of the Miller integrator transistor stage can be altered drastically without appreciably affecting the charge stored on the integrating capacitor.

BRIEF DESCRIPTION OF THE DRAWING

The drawing is an electrical schematic of an actual operative embodiment of the power switch of the present invention.

DESCRIPTION OF THE PREFERRED EMBODIMENT

With reference o the drawing, the operation of the device is as follows. Most of the turn-on and turn-off delay is generated by a Miller integrator comprising transistor 50. The circuit novelty resides in the combination of a complementary bistable multivibrator which includes transistors 20 ad 40 and a Miller integrator, including transistor 30.

The operation of the part of the circuit comprising transistors 20, 40 and 50 is best understood by describing the operation of the entire circuit. With switch $S_1$ open, all the transistors are biased off and capacitors 25 and 35 eventually charge to the full potential $+V$ of the battery, which may be 4.5 volts. When $S_1$ is closed, transistor 50 turns on and capacitor 35 commences discharging at a rate determined by the current through resistor 14 less the current through resistor 12. Assuming that transistor 50 has a sufficiently high $\beta$, this charge rate is constant and the collector electrode of transistor 50 rises linearly. After a predetermined time, approximately 54 milliseconds in an actual operative embodiment, the collector of transistor 50 has risen to about 1.1 volts and transistor 30 is turned on.

Up until this time capacitor 25 has discharged by about 0.5 volt due to current through resistor 18. With transistor 30 in a conducting state, capacitor 25 continues to discharge due to current flow through resistor 18 and the collector current of transistor 30 increases. When the transistor 30 collector current reaches approximately 0.15 milliampere, transistor 20 starts to conduct. This occurs approximaely 70 milliseconds after switch $S_1$ is closed. As the transistor 20 collector current increases, transistors 10 and 40 are turned on. When transistor 40 begins to conduct, resistor 26 is essentially short-circuited and the collector current of transistor 30 increases approximately six fold. This jump in collector current in transistor 30 requires a similar jump in its base current and hence a slight charge of capacitor 25. With the conduction of transistors 20, 30 and 40 established, transistor 10 conducts heavily and capacitor 15 is quickly charged. The output $B^+$ voltage appearing on terminal 13 is applied to the "utilization device," which in the operative embodiment are a variety of logic circuits.

The latter circuits cause a surge of 1 ampere peak for approximately 1 millisecond to be drawn from the battery source, $+V$. This surge occurs when capacitor 15 is within 0.25 volt of being fully charged. Without capacitor 25 in the circuit, any change in battery voltage during the surge will cut off transistor 30 because of the charge stored on capacitor 35, since the battery voltage charge is AC coupled to resistor 18. This in turn will cause transistors 10 and 20 to cease conducting. The output $B^+$ load will be supplied only by filter capacitor 15 and hence the $B^+$ voltage will drop by an amount greater than the battery voltage change. However, with capacitor 25 in the circuit, transistor 30 remains conducting by virtue of the charging of capacitor 25 for at least 25 milliseconds. Diode 11 extends this time by inhibiting the charging of capacitor 25 through resistor 18. Thus the drop in $B^+$ voltage will be no greater than the drop in $+V$, the battery voltage.

The determination of the circuit constants of the configuration illustrated in the drawing is well within the skill of the electronic designer who will choose them in accordance with the particular application of the device. In the actual operative embodiment referred to hereinbefore, the following circuit constants were successfully employed. It must be emphasized however that these constants as well as the voltages and other quantitative measurements are presented solely for purposes of illustration, and are in no way to be construed as limitative of the invention.

Transistors:
- 10, 40, 50—2N3702
- 20, 30—2N3415

Capacitor:
- 15—15 mfd.
- 25, 35—0.47 mfd.

Resistors:
- 12, 14—200 K ohms
- 16, 22—100 K ohms
- 18—33 K ohms
- 24—1.5 K ohms
- 26, 28—10 K ohms Diode 11—Silicon type Using the above values, the total turn-on delay was 98 milliseconds with a +V battery potential of 4.5 volts and 118 milliseconds at 3.5 volts. The turn-off delay was 510 milleseconds at 4.5 volts and 330 milliseconds at 3.5 volts. Without capacitor 25 in the circuit, a 1 ampere surge of current caused a −0.3 volt change in the supply voltage and a −1.0 volt drop in the $B^+$ voltage that lasted for 1 millisecond. With capacitor 25 in the circuit, both voltage drops were −0.3 volt.

It will be apparent from the foregoing description of the invention and its mode of operation that there is provided an improved noise-immune power switch. It should be understood that modification of the arrangement described herein may be required to fit particular operating requirements. Such modifications will be apparent to those skilled in the art. The present invention is not considered limited to the embodiment chosen for purpose of disclosure, and covers all changes and modifications which do not constitute departures from the true spirit and scope of this invention. Accordingly, all such variations as are in accord with the principles discussed previously are meant to fall within the scope of the appended claims.

What is claimed is:

1. A complementary bistable circuit having delayed turn-on and turn-off for noise-free application of a battery potential to a load comprising a plurality of current amplifying devices each having an input, output and control electrode, capacitive means coupling the output and control electrodes of a first of said devices to each other, switch means operatively connected between said control electrode of said first device and a reference potential, means for coupling respectively the input and control electrodes of said first device to said battery potential, means coupling said output electrode of said first device to said reference potential, capacitive means coupling the output and control electrodes of a second of said devices to each other, means for coupling the control electrode of said second device to the output electrode of said first device, means coupling the control and input electrodes of said second device to each other, a first pair of series connected resistive elements for coupling the output electrode of said second device to said battery potential, the input electrode of said second device being connected to the control electrode of a third of said devices, means for coupling respectively the input and control electrodes of said third device to said reference potential, a second pair of series connected resistive elements for coupling the output electrode of said third device to said battery potential, means coupling the output electrode of said third device to the control electrode of a fourth of said devices, the common point of said first pair of resistive elements being connected to the output electrode of said fourth device, the input electrode of said fourth device being connected to said battery potential, the common point of said second pair of resistive elements being connected to the control electrode of a fifth of said devices, the input electrode of said fifth device being connected to said battery potential, capacitive means connected between the output electrode of said fifth device and said reference potential, said load being connected to said output electrode of said fifth device.

2. A circuit as defined in claim 1 wherein said current amplifying devices are transistors and said input, output and control electrodes are respectively the emitter, collector and base electrodes thereof.

3. A circuit as defined in claim 2 wherein said first, fourth and fifth devices are transistors of the PNP conductivity type and said second and third devices are transistors of the NPN conductivity type.

4. A circuit as defined in claim 1 wherein said means for coupling the control electrode of said second device to the output electrode of said first device comprises the series combination of a diode and a resistor.

5. A power switch for noise-free application of a battery potential to a load comprising a plurality of transistors each having an emitter, a collector and a base electrode, first and second transistors each having a capacitor connected between its base and collector, an on-off switch operatively connected between the base of said first transistor and a reference potential, all of said transistors being initially in a non-conducting state, the actuation of said on-off switch to supply current to said load resulting in the completion of the base circuit of said first transistor and the commencement of conduction thereof, the collector of said first transistor being coupled to said reference potential, the emitter of said first transistor being connected to said battery potential, the discharge of the capacitor associated with said first transistor allowing the potential on the collector of said first transistor to achieve a magnitude capable of causing the conduction of said second transistor, means coupling the potential on the collector of said first transistor to the base of said second transistor whereby said last mentioned transistor is driven to a conducting state, resistive means coupling the base and emitter of said second transistor to each other, a first pair of series-connected resistors for coupling the collector of said second transistor to said battery potential, third and fourth transistors, the emitter of said second transistor being connected to the base of said third transistor, resistive means coupling the base electrode of said third transistor to said reference potential, the emitter of said third transistor being connected to said reference potential, the increased conduction of said second transistor in response to the discharge of the capacitor associated therewith resulting in the conduction of said third transistor, the collector of said third transistor being coupled to the base of said fourth transistor, the collector of said fourth transistor being connected to the common point of said first pair of resistors, the emitter of said fourth transistor being connected to said battery potential, a second pair of series-connected resistors for coupling the collector of said third transistor to said battery potential, a fifth transistor having its base connected to the common point of said second pair of resistors, the emitter of said fifth transistor being connected to said battery potential, said fourth and fifth transistors being driven to conduction in response to the conduction of said third transistor, the conduction of said fourth transistor effectively short-circuiting the resistor of said first pair which is connected in parallel with the emitter-collector circuit of said fourth transistor, thereby resulting in increased conduction of said second transistor and the resultant current saturation of said third transistor, a filter capacitor connected between the collector of said fifth transistor and said reference potential, said load being connected to the collector of said fifth transistor.

6. A power switch as defined in claim 5 wherein said first, fourth and fifth transistors are of the PNP variety and said second and third transistors, the NPN variety.

7. A power switch as defined in claim 6 wherein said means coupling the potential on the collector of the first transistor to the base of the second transistor comprises a series connected diode and a resistor, said diode having its anode connected to said first transistor collector and its cathode connected to one end of said resistor, the other end of said resistor being connected to said second transistor base.

References Cited

UNITED STATES PATENTS

| | | | |
|---|---|---|---|
| 3,069,552 | 12/1962 | Thompson -------- | 307—288X |
| 3,401,312 | 9/1968 | Eckl ------------- | 307—293X |
| 3,471,719 | 10/1969 | Hughes ------------ | 307—293 |

JOHN S. HEYMAN, Primary Examiner

U.S. Cl. X.R.

307—246, 247, 293